US008823453B2

(12) United States Patent
Nys et al.

(10) Patent No.: US 8,823,453 B2
(45) Date of Patent: Sep. 2, 2014

(54) INSTRUMENTATION AMPLIFIER WITH RAIL-TO-RAIL INPUT RANGE

(71) Applicant: Semtech Corporation, Camarillo, CA (US)

(72) Inventors: Olivier Nys, Neuchatel (CH); Francois Krummenacher, Chatillens (CH)

(73) Assignee: Semtech Corporation, Camarillo, CA (US)

( * ) Notice: Subject to any disclaimer, the term of this patent is extended or adjusted under 35 U.S.C. 154(b) by 0 days.

(21) Appl. No.: 13/670,743

(22) Filed: Nov. 7, 2012

(65) Prior Publication Data

US 2014/0125413 A1    May 8, 2014

(51) Int. Cl.
*H03F 3/45*    (2006.01)
(52) U.S. Cl.
USPC ............................................. 330/258; 330/69
(58) Field of Classification Search
USPC .................................................. 330/252–261
See application file for complete search history.

(56) References Cited

U.S. PATENT DOCUMENTS

| 4,758,796 | A | 7/1988 | Verhoeven et al. |
| 4,879,531 | A | 11/1989 | Bredmann et al. |
| 5,075,633 | A | 12/1991 | Bowers |
| 5,187,448 | A | 2/1993 | Brooks et al. |
| 6,259,300 | B1 * | 7/2001 | Yasuda et al. ................. 327/333 |
| 6,507,223 | B2 * | 1/2003 | Felder ............................. 327/77 |
| 7,719,351 | B2 | 5/2010 | Pertijs et al. |
| 8,130,035 | B2 | 3/2012 | Welgandt et al. |
| 8,258,863 | B2 | 9/2012 | Gupta et al. |
| 8,476,974 | B2 * | 7/2013 | Froehlich et al. ............... 330/69 |

OTHER PUBLICATIONS

Analog Devices, "Top Five Instrumentation Amplifier Problems" http://dkc1.digikey.com/us/en/tod/ADI/Top-5-Problems-Instrumentation-Amplifiers_NoAudio/Top-5-Problems-Instrumentation-Amplifiers_NoAudio.html, 21 pages.
https://www.google.ch/search?q=instrumentation+amplifier&hl=fr&rlz=1I7DCCH_en&prmd=imvnsb&tbm=isch&tbo=u&source=univ&sa=X&ei=_W5sUILNFcbgtQagsoCAAg&ved=0CD0QsAQ&biw=1081&bih=498.
http://en.wikipedia.org/wiki/Instrumentation_amplifier.
Scott Wurcer & Walt Jung, Analog Devices, "Instrumentation Amplifiers Solve Unusual Design Problems," Aug. 4, 1983, 10 pages.
International Search Report and Written Opinion for Application No. PCT/US13/61554, dated Feb. 24, 2014, 12 pages.

* cited by examiner

*Primary Examiner* — Hieu Nguyen
(74) *Attorney, Agent, or Firm* — Amin, Turocy & Watson, LLP

(57) ABSTRACT

A system and method for adjusting a common mode output voltage in an instrumentation amplifier is provided. In one aspect, the common mode output voltage is increased or decreased with respect to the common mode input voltage to enable high amplification of the signal input to the instrumentation amplifier. Moreover, the common mode output voltage can be driven to (or approximately to) a target voltage value such as, but not limited to, half the supply, even if the common mode input voltage is close to supply or ground rail voltage. Thus, a high amplification of the differential input voltage can be obtained and utilized for various applications requiring rail to rail input.

20 Claims, 12 Drawing Sheets

INSTRUMENTATION AMPLIFIER WITH RAIL-TO-RAIL INPUT RANGE

TECHNICAL FIELD

The subject disclosure relates to instrumentation amplifiers and, more particularly, to an instrumentation amplifier with a rail-to-rail input range.

BACKGROUND

Instrumentation amplifiers are extensively used in analog systems to amplify low level signals in the presence of high common mode noise. As an example, instrumentation amplifiers are typically employed as input amplifiers of signal processing systems. Moreover, instrumentation amplifiers can amplify a differential input signal with a high rejection of common mode input voltage. Typically, instrumentation amplifiers have high input impedance, low input current, and good linearity.

The common mode input range of the amplifier is limited by the following constraint: The input stage of the two amplifiers constituting the instrumentation amplifier must be properly biased. To overcome this constraint, conventional systems employ two differential input pairs of transistors within the instrumentation amplifier, one based on n-channel metal-oxide-semiconductor (NMOS) transistors, and one based on p-channel metal-oxide-semiconductor (PMOS) transistors. The PMOS based differential input transistor pair works accurately for a low common mode input voltage range but not for a common mode input voltage range that is close to the positive supply voltage (Vdd). On the other hand, the NMOS based differential transistor pair works accurately for a high common mode input voltage range, but not when the common mode input voltage range is close to the negative supply rail voltage (Vss). Thus, by combining PMOS and NMOS based differential transistor pairs, the input stages of the conventional amplifiers constituting the differential amplifier can have a rail to rail input range. However, the gain and hence the performance of the conventional amplifier falls down rapidly when the output voltage approaches the positive or negative supply rail (e.g., within a few tens of millivolts).

SUMMARY

The following presents a simplified summary of the specification in order to provide a basic understanding of some aspects of the specification. This summary is not an extensive overview of the specification. It is intended to neither identify key or critical elements of the specification nor delineate any scope particular embodiments of the specification, or any scope of the claims. Its sole purpose is to present some concepts of the specification in a simplified form as a prelude to the more detailed description that is presented later. It will also be appreciated that the detailed description may include additional or alternative embodiments beyond those described in this summary.

The systems and methods disclosed herein, in one aspect thereof, can facilitate increasing an input range of an instrumentation amplifier. In one aspect, the subject system can include an instrumentation amplifier that amplifies a differential input voltage signal to generate a differential output voltage signal; and a feedback circuit that controls a common mode output voltage of the instrumentation amplifier based on the differential output voltage signal. Another aspect relates to a system comprising a first circuit that is configured to determine a common mode output voltage of an instrumentation amplifier based on the output voltage signals of the instrumentation amplifier; and a second circuit that is configured to generate a control signal to minimize a difference between the common mode output voltage and a target voltage. Yet another aspect relates to a method comprising measuring the output voltage signals from an instrumentation amplifier; and based on analyzing the output voltage signals, generating a control signal for adjusting the common mode output voltage to prevent saturation of the instrumentation amplifier.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

The numerous aspects, embodiments, objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
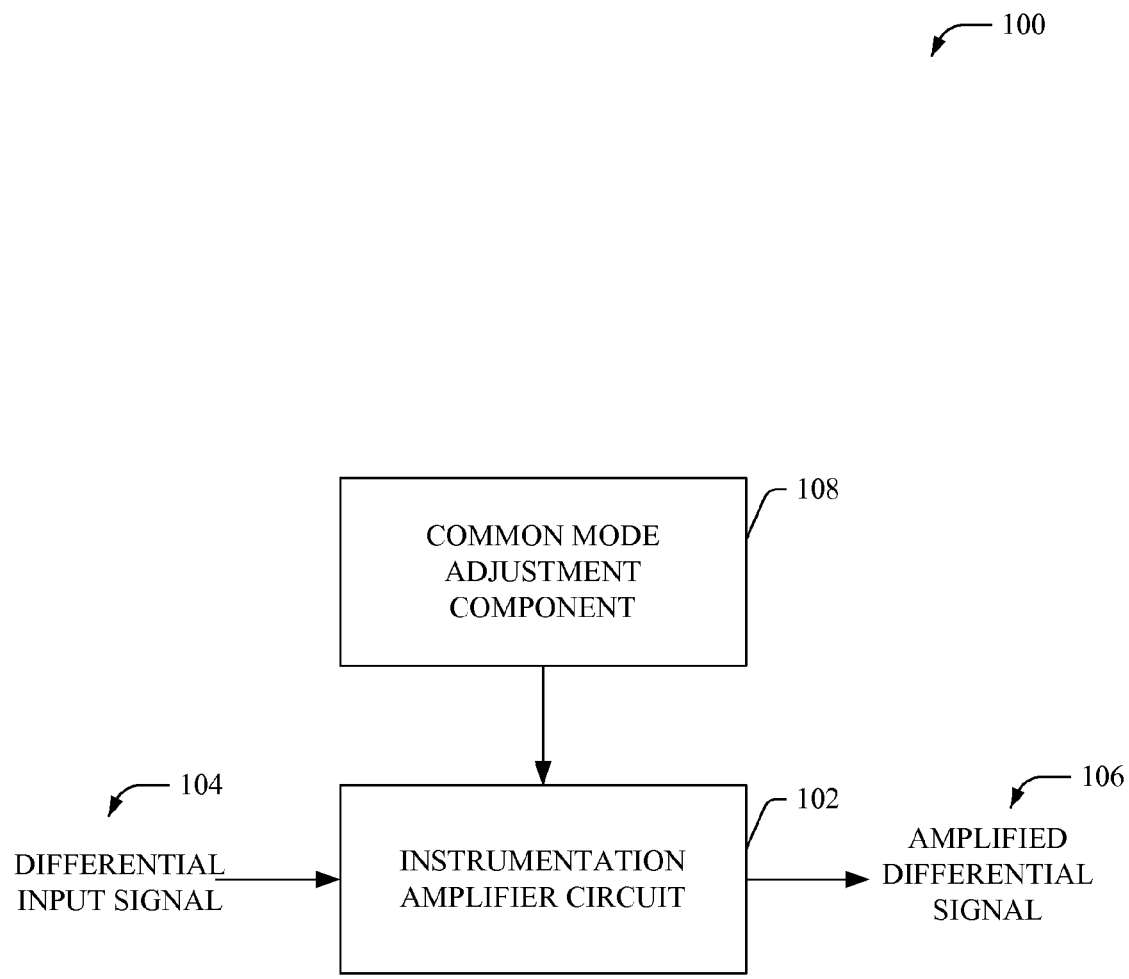
FIG. 1 illustrates an example system that that facilitates increasing an input range of an instrumentation amplifier circuit.

Systems and methods disclosed herein, in one or more aspects, provide an instrumentation amplifier with a rail to rail input range. The subject matter is described with reference to the drawings, wherein like reference numerals are used to refer to like elements throughout. In the following description, for purposes of explanation, numerous specific details are set forth in order to provide a thorough understanding of the subject innovation. However, that the subject matter may be practiced without these specific details.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling.

Initially, referring to FIG. 1, there illustrated is an example system 100 that facilitates increasing an input range of an instrumentation amplifier circuit 102, according to an aspect of the subject disclosure. In one aspect, the instrumentation amplifier circuit 102 can be employed to amplify a relatively small differential input signal, for example, received from a sensor (e.g., resistive of capacitive bridge) while providing a high input impedance. Such amplification can be utilized to adapt the range of the input signal to the range of an analog to digital (A/D) converter (not shown) in order to digitize the signal from the sensor.

In one aspect, the instrumentation amplifier circuit 102 can include a set of operational amplifiers (OPAMPs), for example, a differential amplifier with input buffers that can eliminate the need for input impedance matching. As an example, the instrumentation amplifier circuit 102 can have a low direct current (DC) offset, low drift, low noise, high open-loop gain, high common-mode rejection ratio, and high input impedances. Based on a differential input signal 104, the instrumentation amplifier circuit 102 can generate an amplified differential signal 106 with a high rejection of common mode input voltage. Typically, the common mode input range of the instrumentation amplifier circuit 102 is limited by the following two constraints: (i) the input stage of the two amplifiers constituting the instrumentation amplifier circuit 102 must be properly biased; and (ii) the output nodes cannot be driven outside the supply range. Moreover, the gain and hence the performance of the instrumentation amplifier circuit 102 decreases rapidly when the output voltage approaches the positive supply rail (Vdd) or the negative supply rail (Vss) (e.g., within a few tens of millivolts). In one example, the instrumentation amplifier circuit 102, not only amplifies the differential signal but also transfers the common mode voltage from input to output with unity gain. Accordingly, a high differential gain can only be achieved when the input range is far from each supply rails and the output voltages nodes are not clamped by the closest supply voltage (Vdd or Vss). Thus, to avoid voltage clamping and increase input range of the instrumentation amplifier circuit 102, system 100 includes a common mode adjustment component 108 that facilitates shifting the common mode output voltage with respect to the common mode input voltage, in order to allow a high amplification of the input signal, independent of the common mode input voltage.

In one example, the common mode adjustment component 108 can introduce a controlled common mode current through feedback resistors within the instrumentation amplifier circuit 102 and dynamically shift (e.g., increase or decrease) the common mode output voltage with respect to the common mode input voltage. In another example, the common mode adjustment component 108 can control voltage at a control node between input resistors within the instrumentation amplifier circuit 102 and dynamically shift the common mode output voltage with respect to the common mode input voltage. Moreover, the common mode adjustment component 108 can employ most any circuit to drive the common mode output voltage close to half of the supply voltage (Vdd/2), for example, even if the common mode input voltage is close to supply or ground rail. Accordingly, the common mode adjustment component 108 can allow the instrumentation amplifier circuit 102 to realize a high amplification independent of the common mode input voltage.

As an example, system 100 can be utilized for applications requiring rail to rail input and/or for applications wherein the common mode input voltage is unknown, changes drastically, and/or cannot be estimated in advance. It can be appreciated that the design of system 100 can include different component selections, topologies, etc., to achieve a control signal that dynamically adjusts the common mode output voltage with respect to the common mode input voltage to prevent voltage clamping and/or errors in the output of the instrumentation amplifier circuit 102. Moreover, it can be appreciated that the instrumentation amplifier circuit 102 and the common mode adjustment component 108 can include most any electrical circuit(s) that can include components and circuitry elements of any suitable value in order to implement the embodiments of the subject innovation. Furthermore, it can be appreciated that the components of system 100 can be implemented on one or more integrated circuit (IC) chips.

Figure 2A:
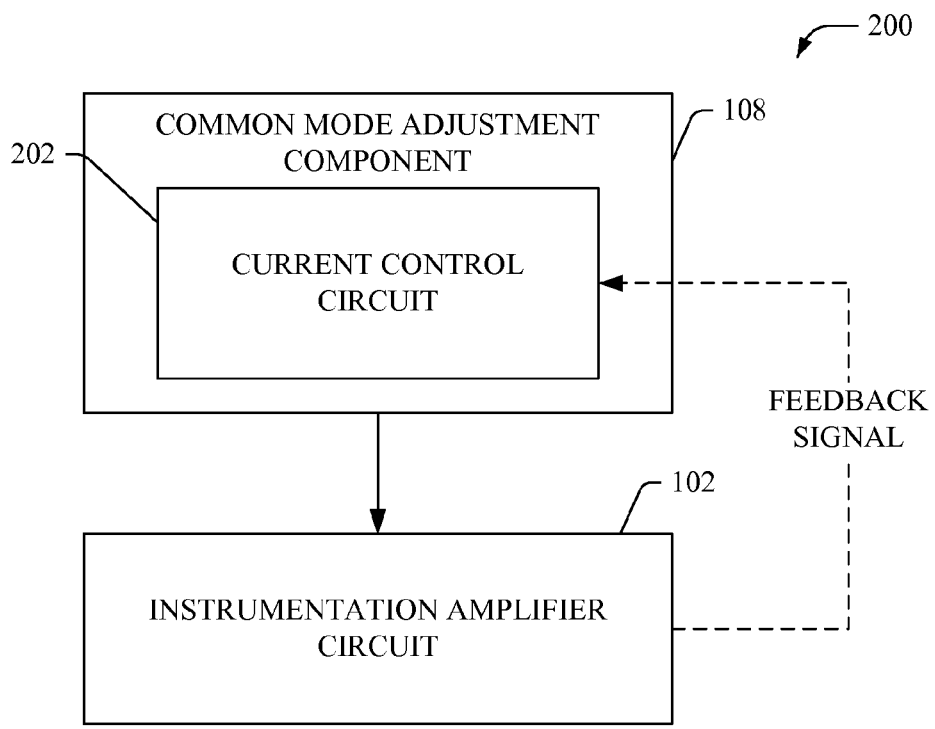
FIGS. 2A-2B illustrate example systems for adjusting a common mode output voltage of the instrumentation amplifier circuit.
Figure 2B:
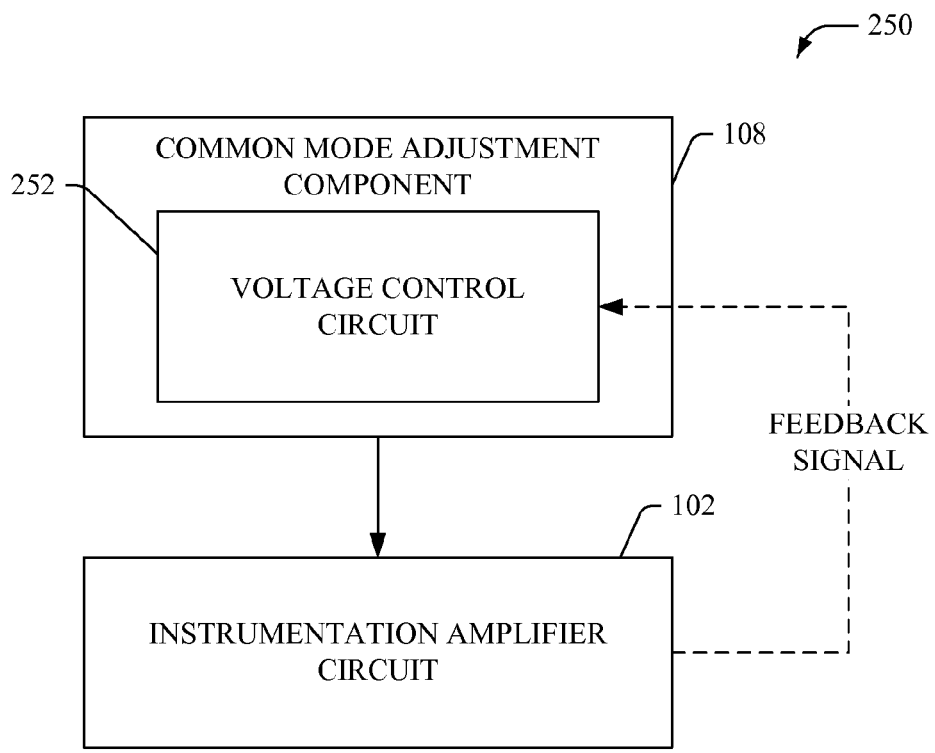

Referring now to FIGS. 2A-2B, there illustrated are example systems (200, 250) for adjusting the common mode output voltage of an instrumentation amplifier circuit 102, according to an aspect of the specification. In one aspect, system 200 includes a current control circuit 202 that facilitates adjustment of the common mode output voltage (e.g., to avoid saturation of the instrumentation amplifier circuit 102) based on sinking or sourcing a controlled common mode current through feedback resistors within the instrumentation amplifier circuit 102. Moreover, the controlled common mode current can be utilized to drive the common mode output voltage of the instrumentation amplifier circuit 102 to a target voltage value (and/or to fall within a target voltage range). For example, the target voltage value can be half of the supply voltage (e.g., Vdd/2).

In one example, the current control circuit 202 can dynamically generate the common mode current based on a feedback signal (e.g., common mode output voltage signal) received from the instrumentation amplifier circuit 102. Moreover, the current control circuit 202 can control the value of the common mode current based on the feedback signal. Alternatively, in another example, the value of the common mode current can be constant, for example, in applications wherein the common mode input voltage is known and/or can be estimated in advance. In yet another example, the current control circuit 202 can be activated only when it is detected (e.g., based on the feedback signal) that the instrumentation amplifier circuit 102 is saturated and/or can be always-on.

According to an embodiment, the current control circuit 202 can measure the common mode output voltage of the instrumentation amplifier circuit 102 and compare the common mode output voltage to a target voltage value (and/or range). Based on the comparison, the current control circuit 202 can increase or decrease the common mode current such that common mode output voltage is adjusted to the target voltage value (and/or is within the target voltage range). As an example, the current control circuit 202 can include one or more controlled current sources to facilitate generation of the common mode current.

FIG. 2B illustrates an example system 250 that facilitates adjustment of the common mode output voltage (e.g., to avoid saturation of the instrumentation amplifier circuit 102) based on controlling voltage at a node between input resistors within the instrumentation amplifier circuit 102. In one aspect, the system 250 includes a voltage control circuit 252 that controls the voltage at the node to modify the current flowing through the input resistors and thus, drive the common mode output voltage of the instrumentation amplifier circuit 102 to a target voltage value (and/or to fall within a target voltage range). For example, the target voltage value can be half of the supply voltage (e.g., Vdd/2).

In one example, the voltage control circuit 252 can dynamically control the voltage across the input resistors based on a feedback signal (e.g., common mode output voltage signal) received from the instrumentation amplifier circuit 102. For example, the voltage control circuit 252 can measure the common mode output voltage of the instrumentation amplifier circuit 102 and compare the common mode output voltage to a target voltage value (and/or range). Based on the comparison, the voltage control circuit 252 can increase or decrease the voltage at the node such that common mode output voltage is adjusted to the target voltage value (and/or is within the target voltage range). As an example, the voltage control circuit 252 can include a controlled voltage source. Moreover, the voltage source can be controlled based on the feedback signal. In another example, the value of the voltage source can be constant, for example, in applications wherein the common mode input voltage is known and/or can be estimated in advance. In yet another example, the voltage control circuit 252 can be activated only when it is detected (e.g., based on the feedback signal) that the instrumentation amplifier circuit 102 is saturated and/or can be always-on.

As an example, systems 200 and/or 250 can be implemented by employing most any circuits and can be utilized in different applications, such as, but not limited to audio/media systems, automation systems, robotics, etc. In one example, systems 200 and/or 250 can be utilized to accurately amplify sensor data collected and/or measured by a sensor (e.g., optical sensor, motion sensor, temperature sensor, pressure sensor, sound sensor, etc.) and the amplified signal can be directed to an analog to digital converter to digitize the sensor signal.

Figure 3:
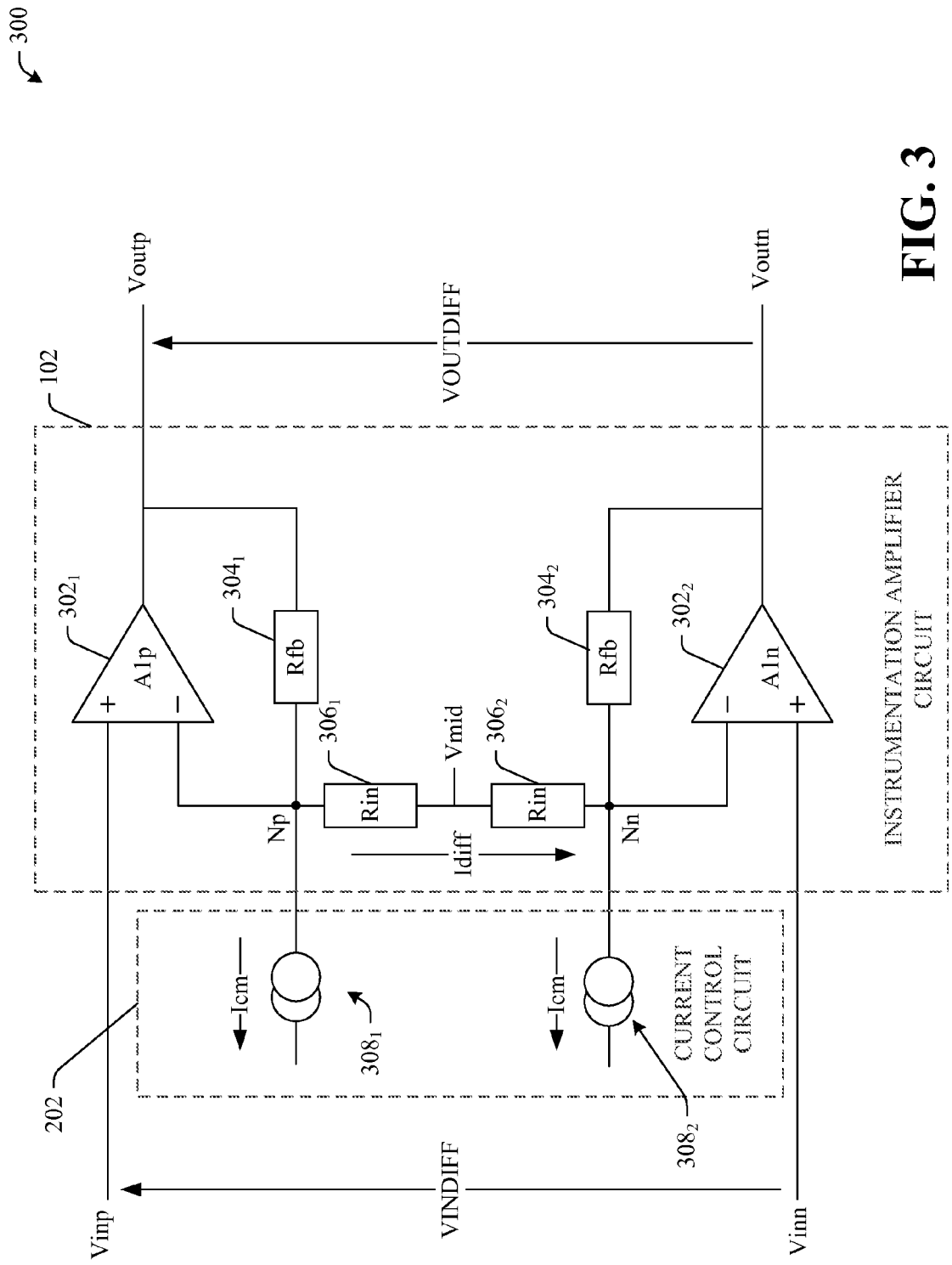
FIG. 3 illustrates an example circuit utilized for controlling the common mode output voltage of the instrumentation amplifier circuit by employing two controlled current sources.

FIG. 3 illustrates an example circuit 300 utilized for adjusting common mode output voltage of an instrumentation amplifier circuit 102 by employing two controlled current sources, according to an aspect of the subject disclosure. In one aspect, the instrumentation amplifier circuit 102 can include two single ended amplifiers Alp ($302_1$) and Aln ($302_2$), each with a resistor Rfb ($304_1$, $304_2$) in the feedback path between negative input and output, and a resistor of value 2*Rin between virtual grounds (Np, Nn) of both amplifiers ($302_1$, $302_2$). For purpose of simplifying the explanations herein, the resistor of value 2*Rin is illustrated as two input resistors ($306_1$, $306_2$) of value Rin each in series, with an internal node Vmid. It can be appreciated that the subject disclosure is not limited to employing two input resistors ($306_1$, $306_2$) and that the instrumentation amplifier circuit 102 can include a single input resistor of value 2*Rin that is connected between Np and Nn.

As an example, Alp ($302_1$) and Aln ($302_2$) can be ideal amplifiers, with no offset and/or infinite gain, such that node Np is at same voltage as Vinp, and Nn at same voltage as Vinn. Further, amplifiers Alp ($302_1$) and Aln ($302_2$) can have high input impedance (and thus no input current). Accordingly, the same current Idiff flows through all the input resistors ($306_1$, $306_2$). This current can be determined as follows:

$$Idiff = \frac{V(Np) - V(Nn)}{2Rin} = \frac{Vinp - Vinn}{2Rin} = \frac{VINdiff}{2Rin} \quad (1)$$

wherein V(Np) is the voltage at node Np, V(Nn) is the voltage at node Nn, Vinp is the positive input voltage, Vinn is the negative input voltage, VINdiff is the input voltage difference, and Rin is the resistance of the input resistor ($306_1$/$306_2$). Further, the voltage Vmid at the point between the two input resistors ($306_1$, $306_2$) corresponds to the common mode input voltage (VCMIN) and can be determined as follows:

$$Vmid = \frac{V(Np) + V(Nn)}{2} = \frac{Vinp + Vinn}{2} = VCMIN \quad (2)$$

Prior to introducing a common mode current (Icm), the current through all the resistors ($306_1$, $306_2$, $304_1$, $304_2$) is the same and the output voltages Voutp and Voutn can be determined as follows:

$$Voutp = Vinp + Rfb \cdot Idiff = Vinp + Rfb\frac{VINdiff}{2Rin} \quad (3)$$

$$Voutn = Vinn - Rfb \cdot Idiff = Vinn - Rfb\frac{VINdiff}{2Rin} \quad (4)$$

Thus, the differential output voltage can be determined as:

$$VOUTdiff = Voutp - Voutn \quad (5)$$

$$= Vinp - Vinn + Rfb\frac{VINdiff}{Rin}$$

$$= VINdiff\left(1 + \frac{Rfb}{Rin}\right) \quad (6)$$

$$= Gdiff \cdot VINdiff \quad (7)$$

Wherein $$Gdiff = 1 + \frac{Rfb}{Rin}$$

is the differential gain.

Further, the common mode output voltage is determined as:

$$VCMOUT = \frac{Voutp + Voutn}{2} = \frac{Vinp + Vinn}{2} = VCMIN \quad (8)$$

Thus the common mode voltage is the same at the output as at the input, but the differential mode is amplified by Gdiff. Accordingly, in one example, if a high differential signal is expected at the output of the instrumentation amplifier circuit 102 (absolute value of VOUTdiff close to the supply voltage), the common mode output voltage should be equal to or approximately equal to target voltage, such as but not limited to, half the supply voltage (Vdd/2). For example, if the common mode input voltage is and/or is around half the supply voltage the differential input signal can be amplified properly. Moreover, in this example scenario a large differential output signal (Voutp−Voutn) can be generated by the instrumentation amplifier circuit 102, while both of these output voltages (Voutp, Voutn) remain between the supply voltages Vdd and Vss (e.g., with some margin in order to ensure proper operation of the output drivers of the amplifiers). Alternatively, in another example, if the common mode input voltage is close to Vss or Vdd, the amplifiers Alp ($302_1$) and/or Aln ($302_2$), can operate in saturation mode and the output voltage (Voutp or Voutn) can be clamped to Vss or Vdd.

In one aspect, to prevent output voltage clamping, current control circuit 202 can facilitate supplying a common mode current (Icm) through each feedback resistor ($304_1$, $304_2$) in order to shift the common mode output voltage with respect to the common mode input voltage. Moreover, the current control circuit 202 can include controlled current sources ($308_1$, $308_2$) that sink or source two matched common mode currents (Icm) to or from nodes Np and Nn. Accordingly, both output voltages Voutp and Voutn are increased or decreased by the same voltage (Rfb*Icm), such that the differential mode output voltage remains unchanged but the common mode voltage is increased (shifted up), assuming an Icm current flow as illustrated in the FIG. 3, or decreased (shifted down), assuming Icm flows in the opposite direction. In one example, the common mode currents (Icm) drive the common mode output voltage to be centered around a specified voltage (e.g., half of supply voltage) and/or lie within a specified voltage range. It can be noted that the specified voltage can include any voltage value (e.g., predefined and/or dynamically determined) between Vdd and Vss, for example, that prevents an output node saturated or clamped by positive or negative supply voltage. Based on the supplied common mode current (e.g., by the controlled current sources ($308_1$, $308_2$)), the output voltages can be determined as follows:

$$Voutp = Vinp + Rfb \cdot Idiff + Rfb \cdot Icm \quad (9)$$
$$= Vinp + Rfb \frac{VINdiff}{2Rin} + Rfb \cdot Icm$$
$$Voutn = Vinn - Rfb \cdot Idiff + Rfb \cdot Icm \quad (10)$$
$$= Vinp - Rfb \frac{VINdiff}{2Rin} + Rfb \cdot Icm$$

The current Idiff flows only through the input resistors ($306_1$, $306_2$), while the current Icm+/−Idiff flows through the feedback resistors ($304_1$, $304_2$). By controlling the common mode currents (Icm), the common mode output voltage can be adjusted. As an example, the common mode currents (Icm) can be generated permanently in order to always force the common mode output voltage to equal and/or approximately equal a target voltage value, or the common mode currents (Icm) can be generated only when required in order to avoid saturation or clamping of one of the output nodes. For example, a sensing circuit (not shown) can be utilized to sense when the voltage (Voutp, Voutn) at the one of the output nodes is saturated or clamped to Vdd or Vss. In one aspect, the current sources ($308_1$, $308_2$) can be generated in different ways, for example, but not limited to, employing MOS transistors in their saturation regions. Both current sources ($308_1$, $308_2$) can be matched in order to maintain a good common mode input rejection (e.g., to avoid common mode voltage variations being transformed into differential signal) and have low noise characteristics.

It can be appreciated that the input resistors ($306_1$, $306_2$) and the feedback resistors ($304_1$, $304_2$) can have suitable resistance values (Rin, Rfb) and/or ratios) depending on the application. Further, amplifiers Alp ($302_1$) and Aln ($302_2$) can have most any gain value depending on the application.

Figure 4:
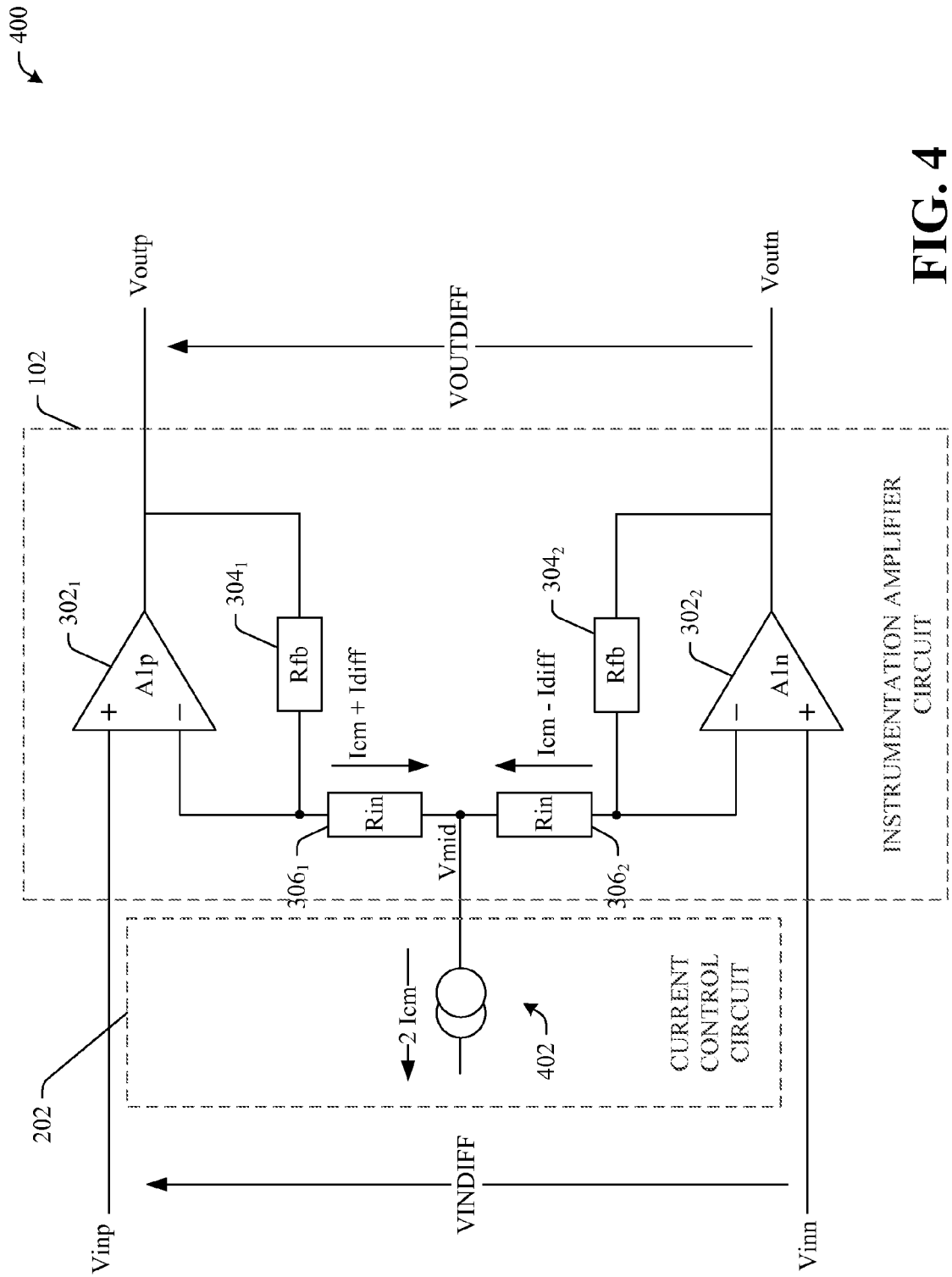
FIG. 4 illustrates an example circuit that facilitates common mode current control by employing a controlled current source and provides a high common mode input rejection.

FIG. 4 illustrates an example circuit 400 that facilitates common mode current control and provides a high common mode input rejection in accordance with an aspect of the disclosure. In one embodiment, the instrumentation amplifier circuit 102, amplifiers ($302_1$, $302_2$), feedback resistors ($304_1$, $304_2$), input resistors ($306_1$, $306_2$), include functionality, as more fully described with respect to systems/circuits 100, 200, and 300. Further, the current control circuit 202 includes functionality, as more fully described with respect to systems 100 and 200. In contrast with the embodiment in FIG. 3, system the current control circuit 202 in circuit 400 employs a single controlled current source 402 that provides the common mode current (2Icm). As an example, the single controlled current source 402 provides good common mode input rejection and avoids common mode voltage variations being transformed into a differential signal.

According to an aspect, the current control circuit 202 causes a current (Icm) to flow through the input resistors ($306_1$, $306_2$), by sinking or sourcing a current of 2*Icm from or to the node Vmid between the two input resistors ($306_1$, $306_2$). The equations of Voutp and Voutn are the same as given by equations 9 and 10 respectively. As an example, the common mode current (2*Icm) drives the common mode output voltage to be centered around a specified voltage (e.g., half of supply voltage) and/or lie within a specified voltage range. It can be noted that the specified voltage can include any voltage value between Vdd and Vss, for example, that prevents an output node saturated or clamped by positive or negative supply voltage. Moreover, the current control circuit 202 controls the current source 402 to control the voltage at node Vmid. For example, the voltage at node Vmid is decreased (pulled below) or increased (pulled above) based on the common mode current. Moreover, $$Vmid = VCMIN - Rin \cdot Icm \quad (11)$$

Thus, if the current control circuit 202 determines that common mode input voltage (VCMIN) is low (e.g., close to Vss, within a predefined voltage range, below a predefined voltage threshold, etc.), then the current flow of 2Icm can be in the same direction as indicated in FIG. 4 in order to increase the common mode output by decreasing the voltage at Vmid (e.g., the voltage at Vmid can be pulled below VCMIN). Alternatively, if the current control circuit 202 determines that the common mode input voltage is high (e.g., close to Vdd, within a predefined voltage range, above a predefined voltage threshold, etc.), then the voltage at Vmid can be increased (e.g., the voltage at Vmid can be pulled above VCMIN) and the direction of the current flow 2Icm is opposite to that indicated in FIG. 4.

In an example, one advantage of the circuit 400 is that the noise of the current source (2*Icm) does not contribute significantly to the noise of the instrumentation amplifier circuit 102, since it is only common mode noise. Differential mode noise can be detected if the resistors ($306_1$ and $306_2$, or $304_1$ and $304_2$) are mismatched; however such noise is strongly attenuated. In one aspect, the common mode current 2*Icm can be generated permanently in order to always force the common mode output voltage to equal, and/or approximately equal, a target voltage value, or can be generated only when required in order to avoid saturation or clamping of one of the output nodes. For example, a sensing circuit (not shown) can be utilized to detect when the voltage at the one of the output nodes is saturated or clamped and accordingly activate the current source 402. In one aspect, the current source 402 can be generated by employing various circuits, for example, but not limited to, employing MOS transistors in their saturation regions.

According to an embodiment, the value of Icm employed in circuits 300 and/or 400 can be determined (e.g., by the current control circuit 202) as follows: Based on averaging equations 9 and 10, $$VCMOUT = VCMIN + Rfb \; Icm \tag{12}$$

$$\text{Thus, } Icm = \frac{VCMOUT - VCMIN}{Rfb} \tag{13}$$

According to another embodiment, Icm can be generated (e.g., by the current control circuit 202) only in order to avoid having one of the output voltages going outside the supply range or at least too close to one of the supplies (e.g., less than a predefined threshold voltage (Vdrop)). Without common mode compensation, the output voltages can be equal to:

$$Voutp = VCMIN + \left(1 + \frac{Rfb}{Rin}\right)\frac{VINdiff}{2} \tag{14}$$

$$Voutn = VCMIN - \left(1 + \frac{Rfb}{Rin}\right)\frac{VINdiff}{2} \tag{15}$$

In an example scenario, if determined (e.g., by the current control circuit 202) that Voutp exceeds Vdd−Vdrop without common mode compensation, then the common mode output voltage should be decreased (e.g., by the current control circuit 202) by:

$$Vshift = \left[VCMIN + \left(1 + \frac{Rfb}{Rin}\right)\frac{|VINdiff|}{2}\right] - [Vdd - Vdrop] \tag{16}$$
$$= -Rfb \; Icm$$

Thus, the current Icm that is to be generated would be determined (e.g., by the current control circuit 202) as:

$$Icm = -\frac{Vshift}{Rfb} \tag{17}$$

$$= -\frac{\left[VCMIN + \left(1 + \frac{Rfb}{Rin}\right)\frac{|VINdiff|}{2}\right] - [Vdd - Vdrop]}{Rfb}$$

This value of Icm (given by equation 17) ensures that Voutp≤Vdd−Vdrop and Voutn=Voutp−(1+Rfb/Rin)*VINdiff. Hence, the common mode compensation is sufficient to avoid saturation of the amplifiers (302₁, 302₂). The Icm value in equation 17 is negative because it is a sourced current.

It can be appreciated that an absolute value of VINdiff is employed in equations 16-17, such that these equations (16, 17) also hold in another example scenario wherein Voutn exceeds Vdd−Vdrop. In another example scenario, if determined (e.g., by the current control circuit 202) that Voutn falls below Vss+Vdrop without common mode compensation, then the common mode output voltage can be increased (e.g., by the current control circuit 202) by:

$$Vshift = [Vss + Vdrop] - \left[VCMIN + \left(1 + \frac{Rfb}{Rin}\right)\frac{|VINdiff|}{2}\right] \tag{18}$$
$$= Rfb \; Icm$$

Thus, the current Icm that is to be generated would be determined (e.g., by the current control circuit 202) as:

$$Icm = \frac{[Vss + Vdrop] - \left[VCMIN + \left(1 + \frac{Rfb}{Rin}\right)\frac{|VINdiff|}{2}\right]}{Rfb} \tag{19}$$

This value of Icm (given by equation 19) ensures that Voutn≥Vss+Vdrop and Voutp=Voutn+(1+Rfb/Rin)*VINdiff. It can be appreciated that an absolute value of VINdiff is employed in equations 18-19, such that these equations (18, 19) also hold the case where Voutp (instead of Voutn) would fall below Vss+Vdrop.

Figure 5:
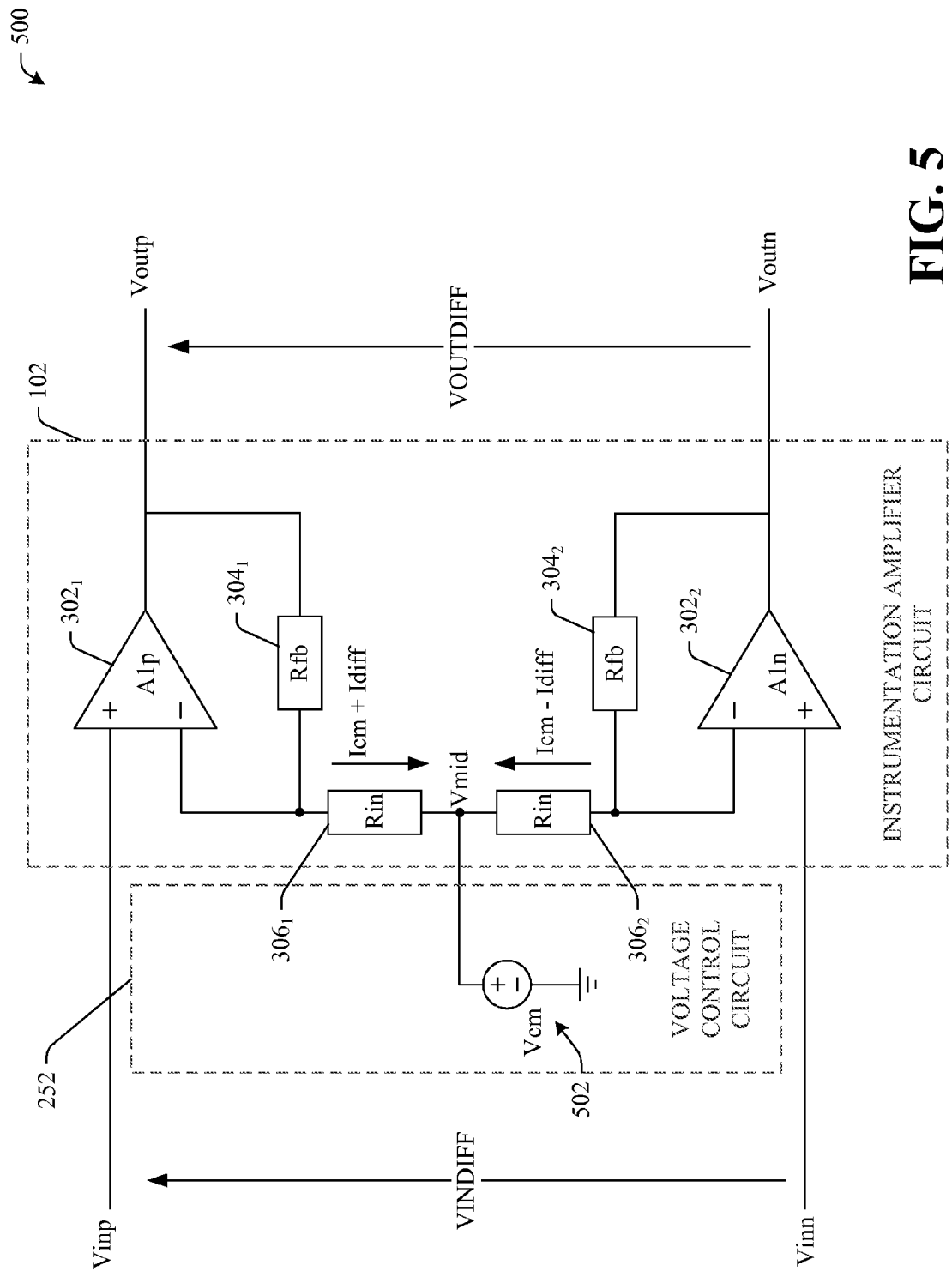
FIG. 5 illustrates an example circuit that facilitates controlling a voltage at a node between input resistors of an instrumentation amplifier circuit to adjust the common mode output voltage.

Referring now to FIG. 5, there illustrated is an example circuit 500 that facilitates controlling voltage at a node between the input resistors (306₁, 306₂) to modify the common mode output voltage in accordance with an aspect of the innovation. In one embodiment, the instrumentation amplifier circuit 102, amplifiers (302₁, 302₂), feedback resistors (304₁, 304₂), input resistors (306₁, 306₂), include functionality, as more fully described with respect to systems/circuits 100, 250, 300, and 400. Further, the voltage control circuit 252 includes functionality, as more fully described with respect to systems 100 and 250.

According to an aspect, voltage control circuit 252 employs a voltage source 502 to control the voltage at node Vmid. Moreover, the common mode output can be controlled by applying the voltage (Vcm) provided by voltage source 502 at Vmid, since the impedance on Vmid is directly determined by the two input resistors (306₁, 306₂) in parallel. As an example, the controlled current source 402 (in FIG. 4) can be replaced by the controlled voltage source 502, as illustrated in FIG. 5. It can be appreciated that the voltage at node Vmid can be controlled by most any voltage source (e.g., with non zero impedance), or most any current source (e.g., with non infinite impedance).

In one aspect, the voltage source 502 is controlled (e.g., by the voltage control circuit 252) to drive the common mode output voltage to be centered around a specified voltage (e.g., half of supply voltage) and/or lie within a specified voltage range. It can be noted that the specified voltage can include any voltage value between Vdd and Vss, for example, that prevents an output node being saturated or clamped at positive or negative supply voltage. For example, the voltage at node Vmid is decreased (pulled below) or increased (pulled above) to the common mode input voltage based on the voltage provided by the voltage source 502. Accordingly, if the voltage control circuit 252 determines that the common mode input voltage (VCMIN) is low (e.g., close to Vss, within a predefined voltage range, below a predefined voltage threshold, etc.), then the common mode output voltage can be increased by decreasing the voltage at Vmid (e.g., the voltage at Vmid can be pulled below VCMIN); else if the voltage control circuit 252 determines that the common mode input voltage is high (e.g., close to Vdd, within a predefined voltage range, below a predefined voltage threshold, etc.), then the voltage at Vmid can be increased (e.g., pulled above VCMIN) to decrease the common mode output voltage.

According to an embodiment, the voltage (Vcm) supplied by the voltage source 502 can be determined (e.g., by the voltage control circuit 252) as follows:

$$Vcm = VCMIN - RinIcm \quad (20)$$

Based on equations 20 and 13, $$Vcm = VCMIN - \frac{Rin}{Rfb}(VCMOUT - VCMIN) \quad (21)$$

In another embodiment, voltage (Vcm) can be determined (e.g., by the voltage control circuit 252) as a minimum voltage value that is sufficient to prevent one of the output voltages to be outside the supply range or to be too close to one of the supplies (e.g., less than Vdrop). From equations 17 and 19, Icm can be determined as:

$$Icm = -\frac{\left[VCMIN + \left(1 + \frac{Rfb}{Rin}\right)\frac{|VINdiff|}{2}\right] - [Vdd - Vdrop]}{Rfb}; \text{ or}$$

$$Icm = \frac{[Vss + Vdrop] - \left[VCMIN + \left(1 + \frac{Rfb}{Rin}\right)\frac{|VINdiff|}{2}\right]}{Rfb}$$

Accordingly, Vcm can be determined (e.g., by the voltage control circuit 252) as $$Vcm = VCMIN - Rin*Icm \quad (22)$$

Figure 6:
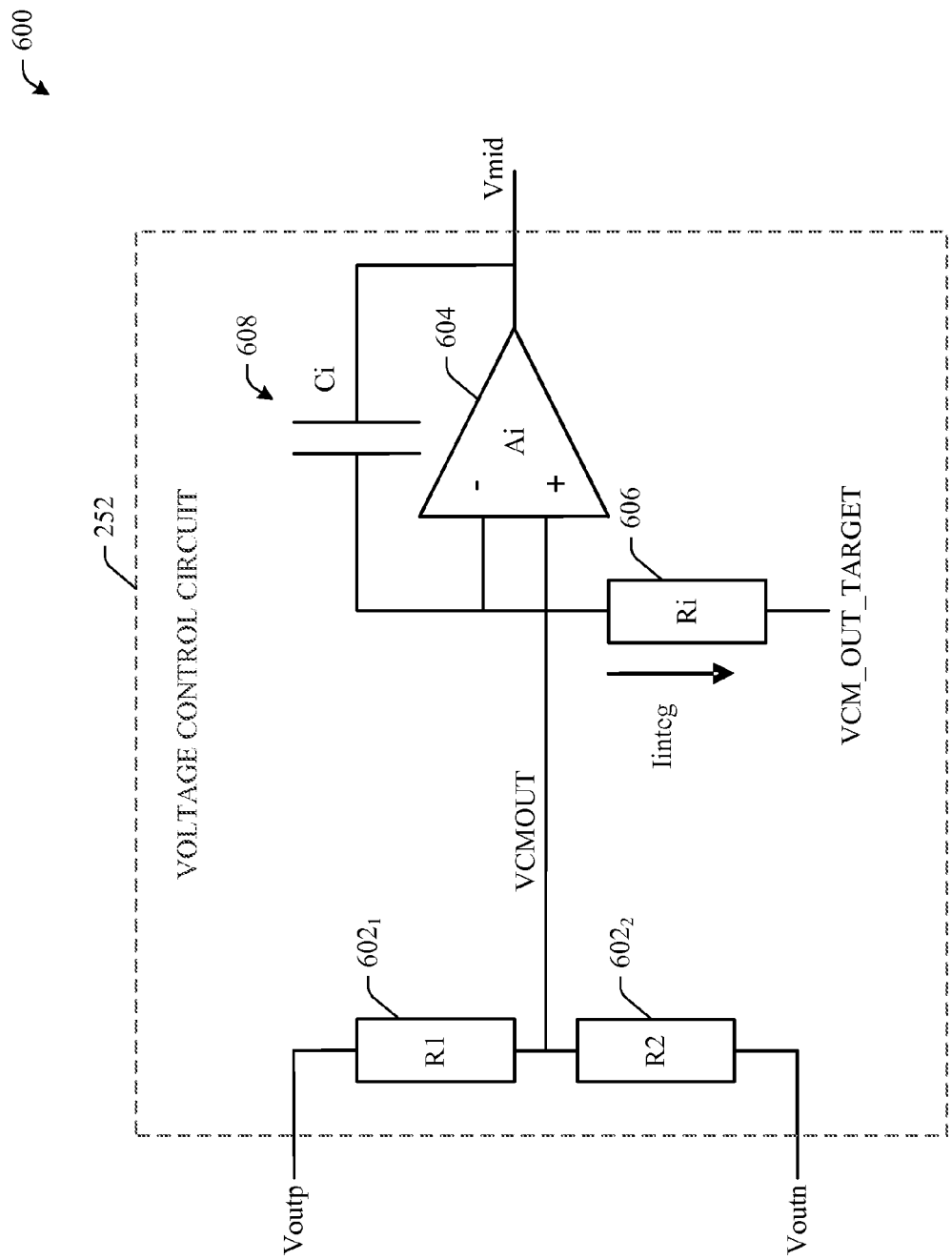
FIG. 6 illustrates an example voltage control circuit utilized to control the common mode output voltage.

FIG. 6 illustrates an example voltage control circuit 600 utilized to control the common mode output voltage. In one aspect, the voltage control circuit 252 includes functionality, as more fully described with respect to systems/circuits 100, 250, and 500. The voltage control circuit 252 provides a feedback loop from the output of the instrumentation amplifier circuit 102 to the input of the instrumentation amplifier circuit 102. According to an embodiment, the voltage control circuit 252 determines the common mode output voltage (VCMOUT) based on a resistive divider circuit comprising resistors $602_1$ and $602_2$. As shown in FIG. 6, VCMOUT is obtained at instrumentation amplifier circuit 102. Further, the voltage control circuit 252 can include a comparator circuit, for example, comprising an auxiliary operational amplifier (OPAMP) 604, a resistor 606 and a capacitor 608. Moreover, the comparator circuit can compare the VCMOUT with a target voltage value (VCMOUT_TARGET). As an example, the comparison can be achieved by applying the voltage difference between VCMOUT and VCMOUT_TARGET across a resistor 606, through the auxiliary amplifier 604. The current Iinteg is integrated onto the capacitor 608 tied in feedback of the auxiliary amplifier 604. Moreover, $$Iinteg = \frac{(VCMOUT - VCMOUT\_TARGET)}{Ri} \quad (23)$$

In one aspect, the output of the auxiliary amplifier 604 can be directly coupled to the node Vmid between the input resistors ($306_1$, $306_2$) within the instrumentation amplifier circuit 102 to control the common mode input voltage.

In one example, if VCMOUT is higher than VCMOUT_TARGET, the integrating current Iinteg will flow through the resistor Ri 606 and the capacitor Ci 608, and accordingly increase the voltage at Vmid. Increasing the voltage at Vmid will then decrease the common mode output voltage, until it reaches the target value (VCMOUT_TARGET). Alternatively, if VCMOUT is lower than VCMOUT_TARGET, the integrating current Iinteg will flow through the resistor Ri 606 and the capacitor Ci 608 in the opposite direction to that indicated in the FIG. 6, and accordingly decrease the voltage at Vmid. Decreasing the voltage at Vmid will then increase the common mode output voltage, until it reaches the target value (VCMOUT_TARGET).

It can be appreciated that the resistors ($602_1$, $602_2$, 606) and the capacitor 608 can have suitable resistance values (and/or ratios) and capacitance values respectively depending on the application. Further, auxiliary amplifier Ai (604) can have most any gain value depending on the application. In addition, it can be appreciated that the circuit illustrated in FIG. 6 is merely one example and that the subject disclosure is not limited to the circuit illustrated in FIG. 6. Moreover, most any circuit for determining VCMOUT and/or comparing VCMOUT with VCMOUT_TARGET can be employed.

Figure 7A:
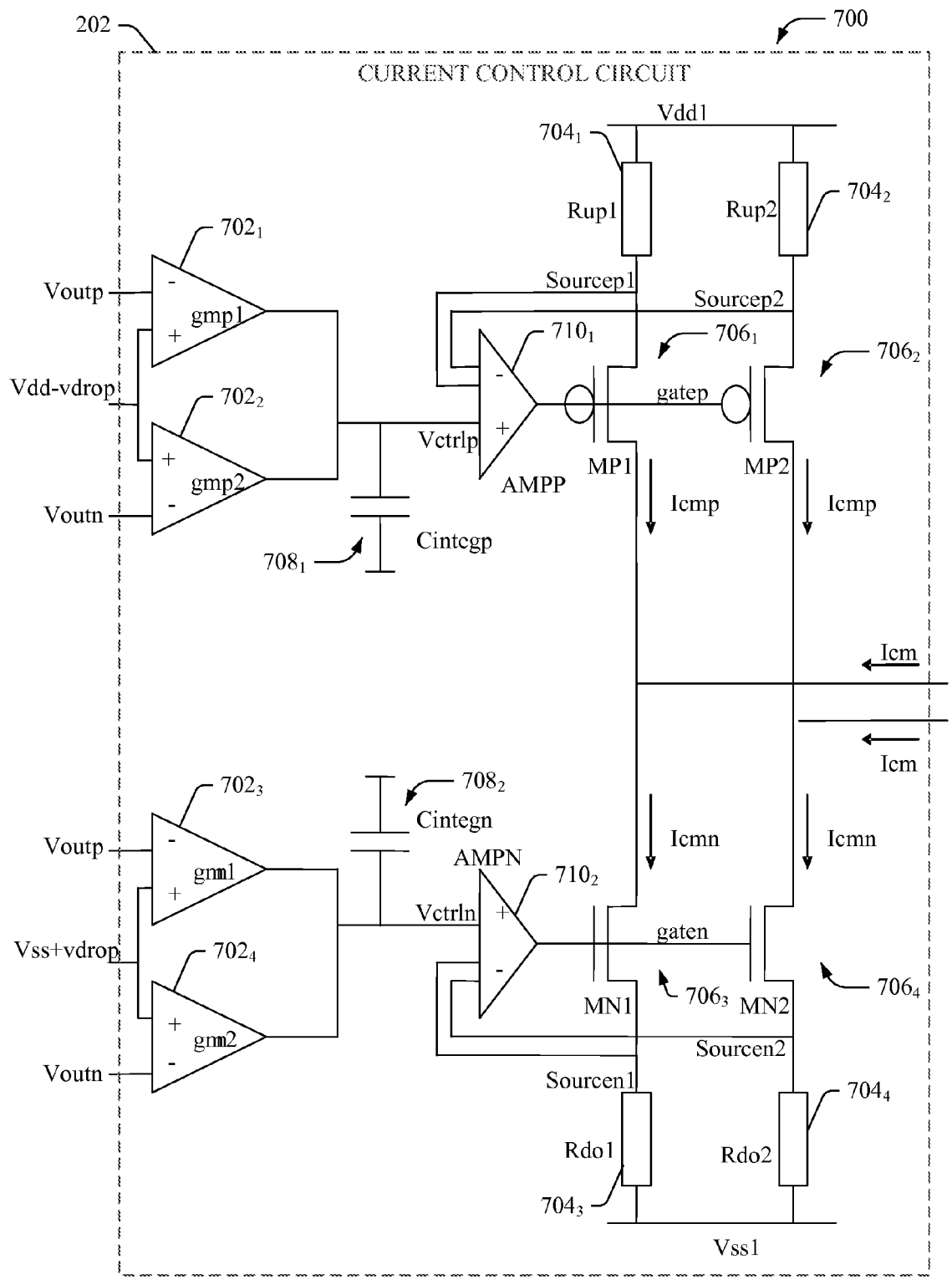
FIGS. 7A-7B illustrate example circuits that prevent output voltages of the instrumentation amplifier from increasing and/or decreasing outside the supply voltage range.
Figure 7B:
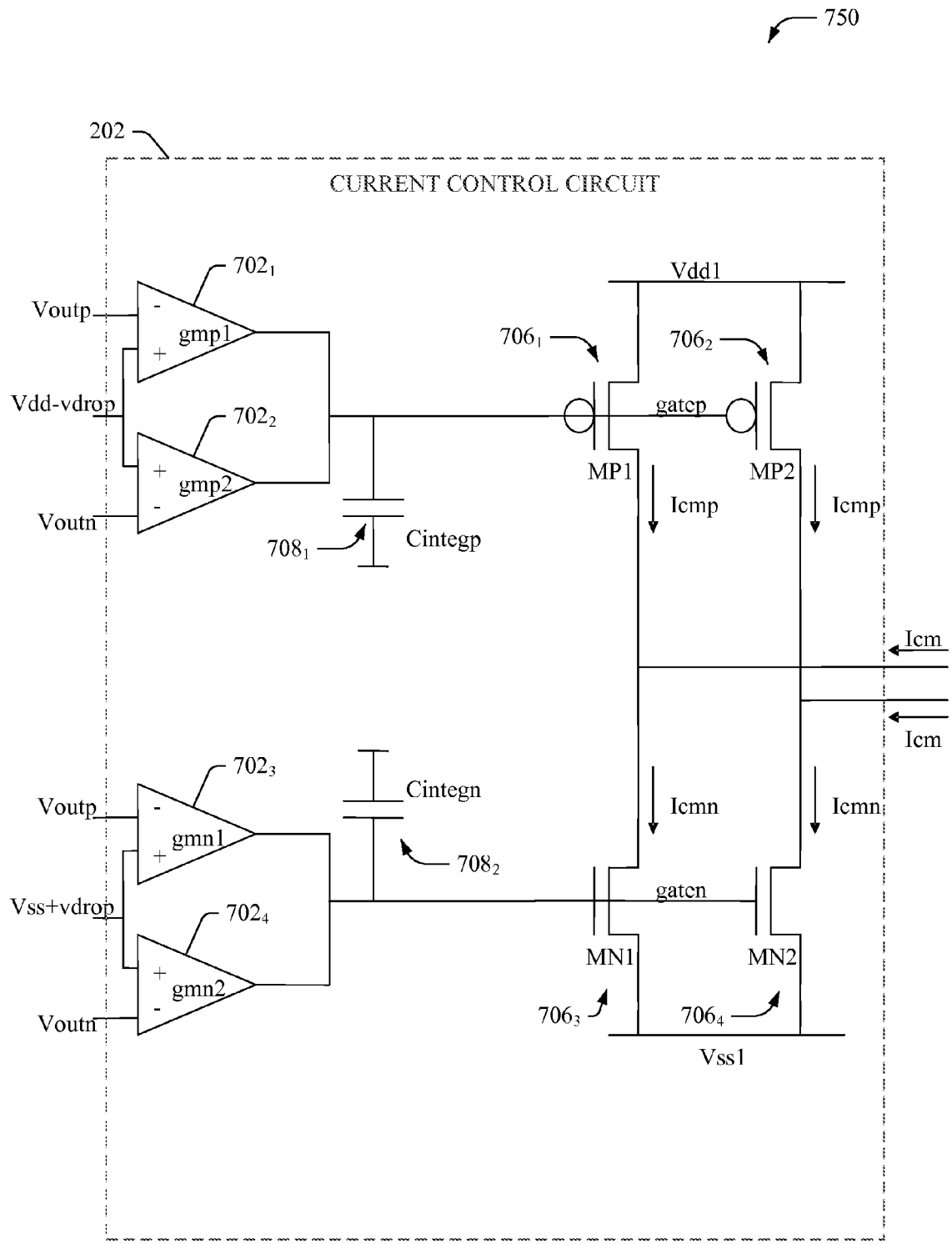

FIGS. 7A-7B illustrate example circuits 700 and 750 that prevent output voltages of the instrumentation amplifier from increasing/decreasing outside the supply voltage range, according to an aspect of the disclosure. In one embodiment, a current control circuit 202 includes functionality, as more fully described with respect to systems/circuits 100, 200, and 300. The current control circuit 202 provides a feedback loop from the output of the instrumentation amplifier circuit 102 to the input of the instrumentation amplifier circuit 102. According to an embodiment, if output voltages Voutp or Voutn increase greater than Vdd−Vdrop, transconductance amplifiers ($702_1$ and $702_2$) can discharge capacitor $708_1$, and decreasing the voltage at node Vctrlp at the input of feedback amplifier $710_1$. The voltage at Vctrlp is copied onto one electrode of two matched resistors ($704_1$ and $704_2$) (and nodes sourcep1 and sourcep2), in order to generate two matched currents Icmp=(Vdd1−Vctrlp)/Rup1. In one example, these currents can be provided by the current control circuit 202 to the virtual grounds (Np, Nn) of the instrumentation amplifier circuit 102, in order to reduce the common mode output voltage in feedback (as described in detail supra with respect to FIG. 3). In another example, these currents can also be provided together by the control circuit 202 to the node Vmid of the instrumentation amplifier circuit 102, in order to reduce the common mode output voltage in feedback (as described in detail supra with respect to FIG. 4).

According to another embodiment, if both Voutp and Voutn are less than Vdd−Vdrop, then transconductance amplifiers ($702_1$ and $702_2$) both pull up (increase the voltage at) node Vctrlp until it reaches Vdd. In this case, both p-channel metal-oxide-semiconductor (PMOS) transistors $706_1$ and $706_2$ will be blocked, so that no current will be injected, as no compensation is required in this case. Accordingly, additional noise source is not added to the instrumentation amplifier circuit 102. According to yet another embodiment, if one output is greater than Vdd−Vdrop and the other one is less than Vdd−Vdrop, a current can be injected to the virtual grounds (Np, Nn), such that the amplifier ($702_1/702_2$) with the highest input has a higher drive than the one with the lowest input. Accordingly, non linear transconductance can thus be employed.

Similar to the above, transconductance amplifiers ($702_3$ and $702_4$), capacitor $708_2$, matched resistors ($704_3$ and $704_4$), n-channel metal-oxide-semiconductor (NMOS) transistors ($706_3$ and $706_4$), and feedback amplifier $710_2$ can generate a current Icm that prevents one of the outputs (Voutp/Voutn) of the instrumentation amplifier circuit decreasing below Vss+Vdrop.

FIG. 7B illustrates an example circuit 750 for supplying common mode currents. Moreover, circuit 750 provides the same functionality as circuit 700, without employing the resistors $704_1$, $704_2$, $704_3$, and $704_4$, and feedback amplifiers $710_1$ and $710_2$. In this example circuit 750, the currents (Icm) are directly controlled by transistors $706_1$ and $706_2$ or $706_3$ and $706_4$. It can be noted that the transconductance amplifiers ($702_1$, $702_2$, $702_3$, and $702_4$), capacitors ($708_1$, $708_2$), transistors ($706_1$, $706_2$, $706_3$, and $706_4$) can include functionality, as more fully described with respect to circuit 700.

It can be appreciated that the resistors ($704_1$, $704_2$, $704_3$, and $704_4$) of system 700 and the capacitors ($708_1$, $708_2$) of systems 700 and 750 can have suitable resistance values (and/or ratios) and capacitance values respectively depending on the application. Further, transconductance amplifiers ($702_1$, $702_2$, $702_3$, and $702_4$) of systems 700 and 750 and/or feedback amplifiers ($710_1$ and $710_2$) of system 700 can have most any gain value depending on the application. Furthermore, although transistors ($706_1$, $706_2$, $706_3$, and $706_4$) are depicted as metal-oxide-semiconductor field effect transistors (MOSFETs), most any transistors (e.g., Bipolar junction transistor) can be utilized. In addition, it can be appreciated that the subject disclosure is not limited to the circuits 700 and 750 and that most any circuit for determining and/or controlling Icm can be employed by the current control circuit 202.

Figure 8A:
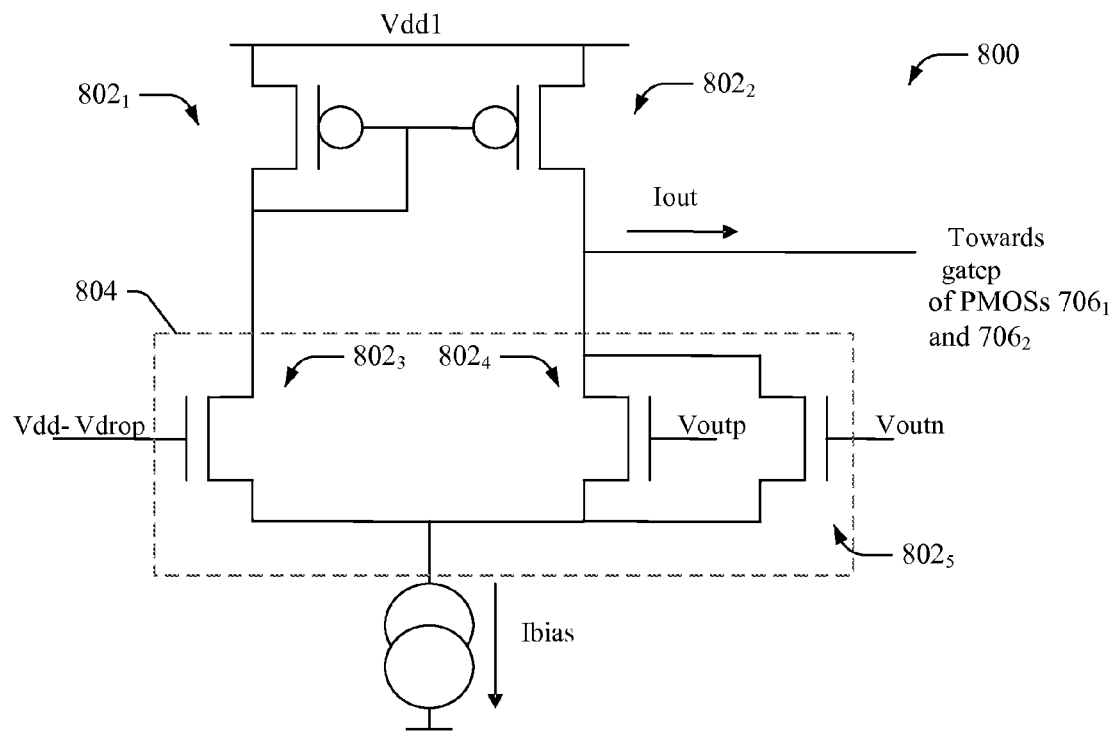
FIGS. 8A-8B illustrate example circuits that determine whether the output voltages of the instrumentation amplifier circuit are within a predefined voltage range.
Figure 8B:
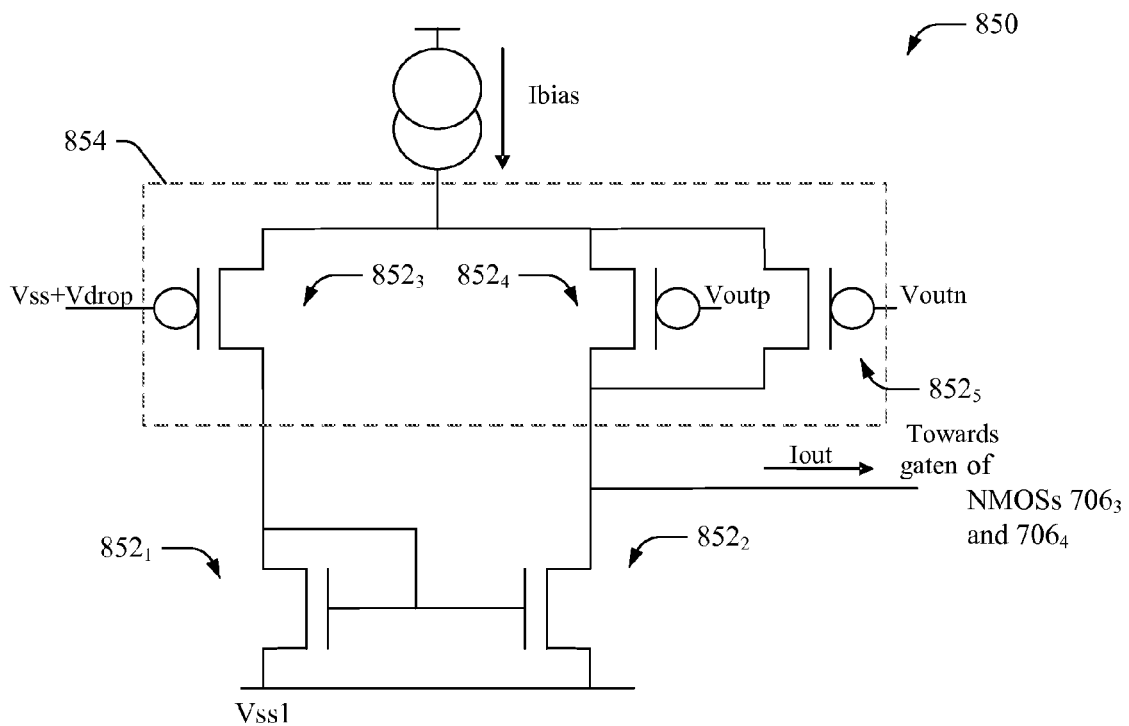

FIGS. 8A-8B illustrate example circuits 800 and 850 that determine whether the output voltages of the instrumentation amplifier circuit 102 are within a predefined voltage range. According to an aspect, the circuits 800 and/or 850 can be employed to control the gate (gatep) of the PMOSs ($706_1$ and $706_2$) and/or the gate (gaten) of the NMOSs ($706_3$ and $706_4$) in circuits 700 and/or 750, for example, instead of utilizing the transconductance amplifiers ($702_1$, $702_2$, $702_3$, and $702_4$).

In one aspect, circuit 800 employs transistors ($802_1$, $802_2$, $802_3$, $802_4$, and $802_5$) to directly compare the maximum of voltages Voutp and Voutn (outputs of the instrumentation amplifier circuit 102) with Vdd−Vdrop. Similarly, circuit 850 employs transistors ($852_1$, $852_2$, $852_3$, $852_4$, and $852_5$) to directly compare the minimum of voltages Voutp and Voutn (outputs of the instrumentation amplifier circuit 102) with Vss−Vdrop. As an example, the circuits 800 and/or 850 include a classical transconductance amplifier circuit with one transistor of the differential pairs (804, 854) split into two transistors ($802_4$, and $802_5$, $852_4$, and $852_5$) with gate of one transistor ($802_4$, $852_4$) coupled to Voutp and gate of the other transistor ($802_5$, $852_5$) coupled to Voutn. In circuit 800, the current in the right side of the differential pair 804 is determined by the higher voltage between Voutp and Voutn, which can then be compared with Vdd−Vdrop. In this example scenario, the output current (Iout) is proportional, or approximately proportional, to (Vdd−Vdrop)−max(Voutp, Voutn), and can be sent to the gatep node to control operation of the PMOSs ($706_1$ and $706_2$).

In circuit 850, the current in the right side of the differential pair 854 is determined by the lower voltage between Voutp and Voutn. Moreover, as the differential pair 854 is realized now by PMOS, it facilitates comparison of Vss+Vdrop with lowest voltage of Voutp and Voutn. In this example scenario, the output current (Iout) is proportional, or approximately proportional, to (Vss+Vdrop)−min(Voutp, Voutn), and can be sent to the gaten node to control operation of the NMOSs ($706_3$ and $706_4$). It can be appreciated that the circuits 800 and/or 850 can be implemented within the current control circuit 202. Further, although transistors ($802_1$, $802_2$, $802_3$, $802_4$, $802_5$, $852_1$, $852_2$, $852_3$, $852_4$, and $852_5$) are depicted MOSFETs, it can be appreciated that most any transistors (e.g., Bipolar junction transistor) can be utilized in circuits 800 and/or 850.

Figure 9:
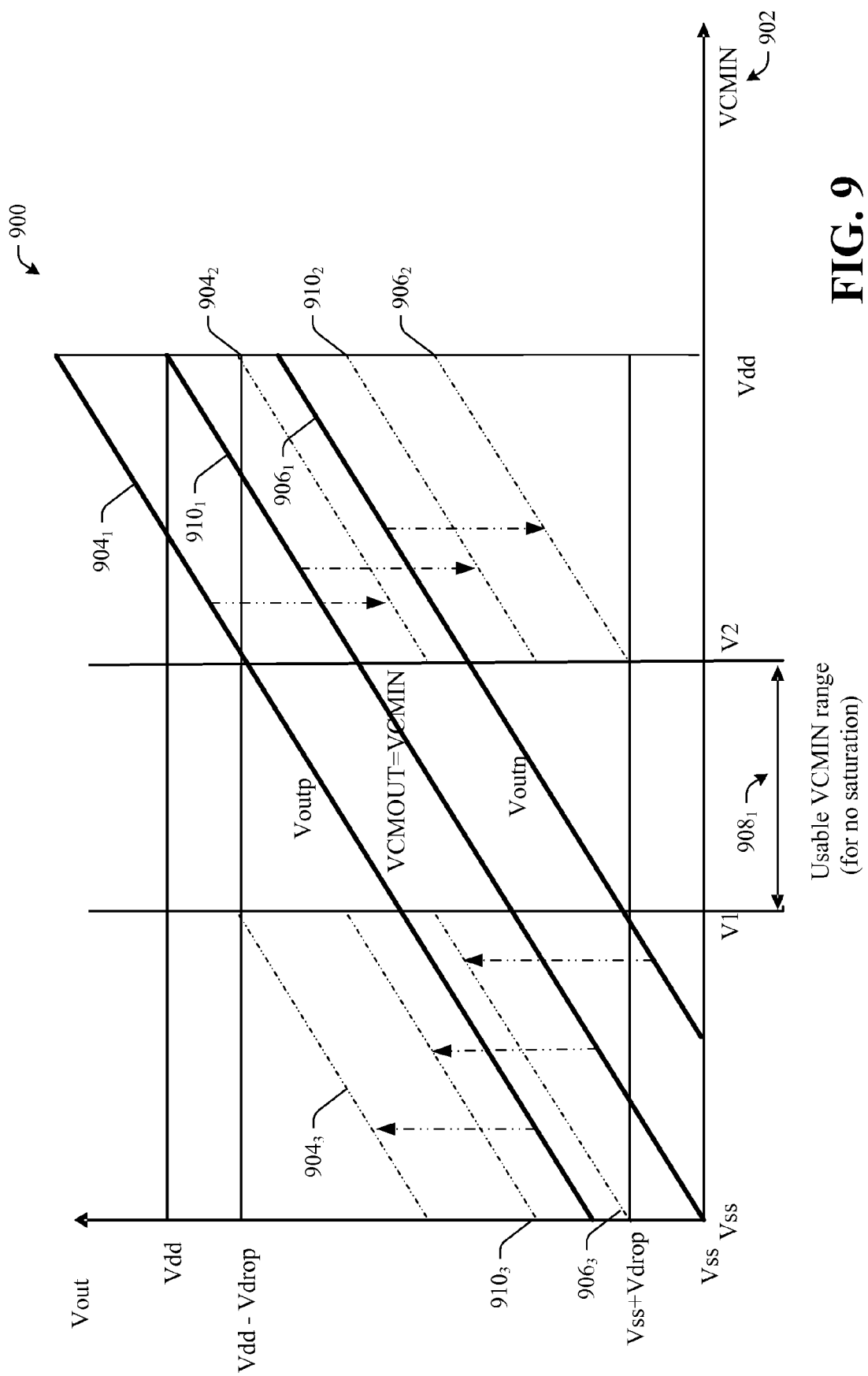
FIG. 9 illustrates an example graph that depicts output voltage of an instrumentation amplifier with a rail to rail input range.

Referring now to FIG. 9, there illustrated is an example graph 900 that depicts output voltage of an instrumentation amplifier with a rail to rail input range. Moreover, graph 900 illustrates the output voltages Voutp $904_1$ and Voutn $906_1$ as a function of the common mode input voltage (VCMIN) 902, assuming a fixed difference (e.g., due to fixed differential input voltage and gain). The usable common mode input range 908 is the region wherein each output Voutp $904_1$ and Voutn $906_1$ remains within the supply voltage range (Vdd−Vss) with a voltage margin Vdrop (thus between Vss+Vdrop and Vdd−Vdrop) in order to achieve proper operation of the amplifiers ($302_1$, $302_2$) (e.g., avoiding operation in the saturation region).

In one example scenario, if Voutp $904_1$ is greater than Vdd−Vdrop (e.g., the region between V2 and Vdd), the VCMOUT $910_1$ can be shifted to $910_2$ by employing the common mode adjustment component 108 (e.g., utilizing the current control circuit 202 or the voltage control circuit 252 described in detail supra with respect to systems/circuits 200-850). Accordingly, Voutp $904_1$ will be shifted to $904_2$, and Voutn $906_1$ will be shifted to $906_2$ (as depicted by the dotted lines). Thus, the amplifiers ($302_1$, $302_2$) will not be saturated and errors in the output of the instrumentation amplifier can be avoided.

In another example scenario, if Voutn $906_1$ is less than Vss+Vdrop (e.g., the region between V1 and Vss), the VCMOUT $910_1$ can be shifted to $910_3$ by employing the common mode adjustment component 108 (e.g., utilizing the current control circuit 202 or the voltage control circuit 252 described in detail supra with respect to systems/circuits 200-850). Accordingly, Voutp $904_1$ will be shifted to $904_3$, and Voutn $906_1$ will be shifted to $906_3$ (as depicted by the dotted lines). Thus, the amplifiers ($302_1$, $302_2$) will not be saturated and errors in the output of the instrumentation amplifier can be avoided.

Figure 10:
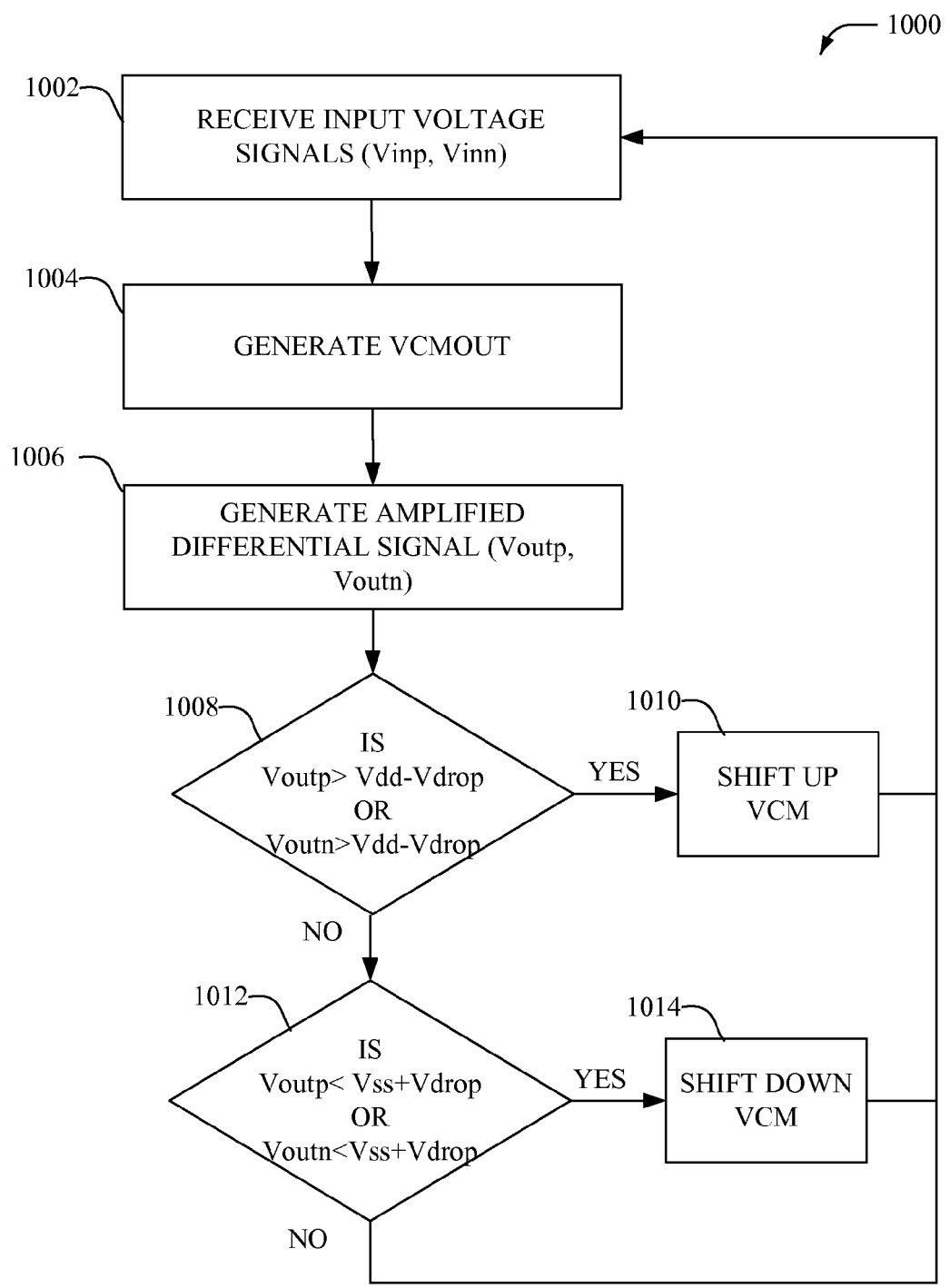
FIG. 10 illustrates an example method for increasing an input range of an instrumentation amplifier.
Figure 11:
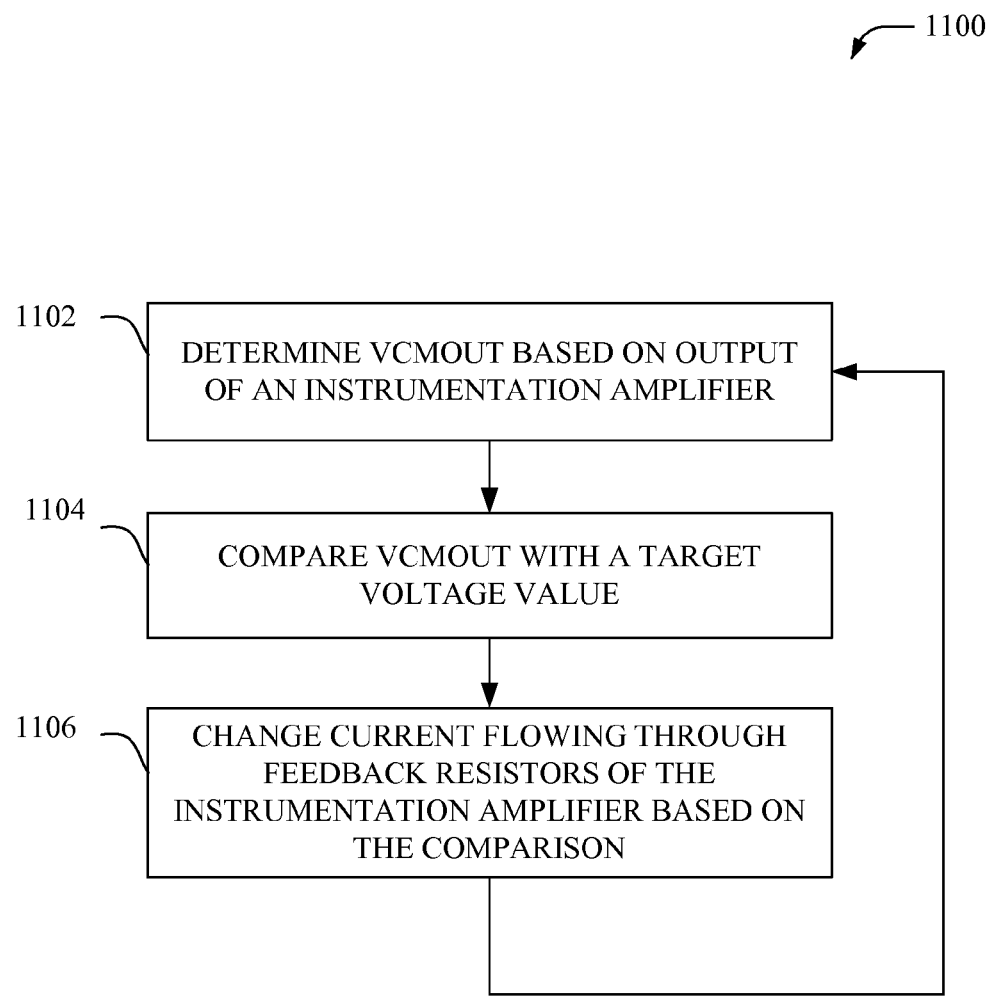
FIG. 11 illustrates an example method for controlling common mode output voltage of the instrumentation amplifier.

FIGS. 10-11 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device or computer-readable storage/communications media.

FIG. 10 illustrates an example methodology 1000 for increasing an input range of an instrumentation amplifier in accordance with an aspect of the subject disclosure. As an example, the instrumentation amplifier can be employed to amplify a relatively small differential input signal, for example, received from a sensor (e.g., resistive of capacitive bridge) while providing a high input impedance. The amplified signal can be provided to an analog to digital (A/D) converter in order to digitize the signal from the sensor.

At 1002, input voltage signals can be received (Vinp, Vinn). At 1004, a common mode output voltage signal (VCMOUT) can be generated, for example by employing the instrumentation amplifier. As an example, the common mode output voltage signal can be equal to or almost equal to the common mode input voltage signal. Further, at 1006, an amplified differential signal (Voutp, Voutn) can be generated based on Vinp and Vinn. Furthermore, Voutp and Voutn can be compared with predefined (or dynamically defined) threshold voltages. Moreover, at 1008, it can be determined whether Voutp or Voutn is greater than Vdd−Vdrop. If determined that Voutp or Voutn is greater than Vdd−Vdrop, at 1010, a feedback control signal (VCM) can be adjusted in order to shift down (decrease) the common mode output voltage, for example, by shifting up (increasing) the VCM signal. Further, at 1012, it can be determined whether Voutp or Voutn is less than Vss+Vdrop. If determined that Voutp or Voutn is less than Vss+Vdrop, at 1014, the feedback control signal (VCM) can be adjusted in order to shift up (increase) the common mode output voltage, for example, by shifting down (decreasing) the VCM signal. In one example, the common mode output voltage can be controlled by modifying a current flowing through feedback resistors of the instrumentation amplifier. As an example, the feedback control signal can include a controlled common mode current signal that can be provided to or sourced from the feedback resistors. In another example, the feedback control signal can include a voltage signal applied at a control node between input resistors of the instrumentation amplifier that can be modified to control the common mode output voltage. Moreover, the feedback control signal can drive the common mode output voltage to, or approximately to, a target voltage value (e.g. Vdd/2). Accordingly, a high amplification of the input voltage signals can be performed independent of the common mode input voltage.

FIG. 11 illustrates an example methodology 1100 for controlling common mode output voltage of an instrumentation amplifier, according to an aspect of the subject specification. At 1102, the common mode output voltage (VCMOUT) can be determined from the voltage signals generated by the instrumentation amplifier. For example, the voltage at the output of the instrumentation amplifier can be averaged (e.g., employing a resistive divider circuit) to determine the common mode output voltage. Further, at 1104, the common mode output voltage can be compared to a target voltage value VCMOUT_TARGET (e.g., Vdd/2). Furthermore at 1106, the current flowing through feedback resistors of the instrumentation amplifier can be controlled based on the comparison, for example, to avoid saturating the instrumentation amplifier and/or avoid errors due to clamping of output voltage to Vdd/Vss. For example, if VCMOUT is greater than VCMOUT_TARGET, the common mode output voltage can be decreased, until it reaches the target value (VCMOUT_TARGET). Alternatively, if VCMOUT is less than VCMOUT_TARGET, the common mode output voltage can be increased, until it reaches the target value (VCMOUT_TARGET).

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above described components, devices, circuits, loops, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. Further, the components and circuitry elements described above can be of any suitable value in order to implement the embodiments of the present invention. For example, the resistors can be of any suitable resistance, capacitors can be of any suitable capacitance, inductors can be of any suitable inductance, amplifiers can provide any suitable gain, voltage sources can provide any suitable voltages, current sources can provide any suitable amperage, etc.

The aforementioned systems/circuits/components/loops have been described with respect to interaction between several components. It can be appreciated that such systems/circuits and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein.

In addition, while a particular feature of the subject innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

What is claimed is:

1. A system, comprising:
   an instrumentation amplifier that amplifies a differential input voltage signal to generate output voltage signals; and
   a feedback circuit that determines a common mode output voltage of the instrumentation amplifier based on the output voltage signals and generates, based on a comparison of the common mode output voltage with a target voltage, a controlled voltage signal that is applied at a control node between input resistors of the instrumentation amplifier and that adjusts the common mode output voltage to prevent saturation of the instrumentation amplifier.

2. The system of claim 1, wherein the feedback circuit comprises:
   two controlled current sources that generate matched common mode current signals, wherein the matched common mode current signals flow through feedback resistors of the instrumentation amplifier.

3. The system of claim 1, wherein the feedback circuit comprises:
a controlled current source that generates a common mode current that flows through input resistors of the instrumentation amplifier.

4. The system of claim 1, wherein the feedback circuit comprises:
a controlled voltage source that adjusts a voltage at the control node.

5. The system of claim 4, wherein the feedback circuit comprises:
a resistive divider circuit that measures the common mode output voltage of the instrumentation amplifier; and
an integrator circuit that modifies a voltage at the control node based on the comparison.

6. The system of claim 5, wherein the target voltage value is half of a supply voltage associated with the instrumentation amplifier.

7. The system of claim 1, wherein the feedback circuit controls the common mode output voltage in response to a determination that at least one of the output voltage signals is clamped at a supply rail voltage.

8. The system of claim 1, wherein the feedback circuit increases the common mode output voltage to ensure that the output voltage signals are within a predefined voltage range.

9. The system of claim 1, wherein the feedback circuit decreases the common mode output voltage to ensure that the output voltage signals are within a predefined voltage range.

10. A method comprising:
measuring output voltage signals from an instrumentation amplifier;
determining a common mode output voltage based on the output voltage signals; and
based on analyzing the output voltage signals, generating a control signal for adjusting the common mode output voltage to prevent saturation of the instrumentation amplifier, wherein the generating comprises generating a controlled voltage signal that is applied at a control node between input resistors of the instrumentation amplifier based on comparing the common mode output voltage with a target voltage.

11. The method of claim 10, wherein the generating comprises generating two controlled current signals that are to be provided to a set of feedback resistors of the instrumentation amplifier.

12. The method of claim 10, wherein the generating comprises generating a controlled current signal that is to be provided to the input resistors of the instrumentation amplifier.

13. The method of claim 10, wherein the adjusting comprises decreasing the common mode output voltage by a minimum voltage value that is sufficient to avoid the saturation of the instrumentation amplifier.

14. The method of claim 10, wherein the analyzing comprises:
comparing the output voltage signals with a predefined voltage range; and
based on the comparing, determining that at least one of the output voltage signals does not lie within the predefined voltage range, wherein the control signal is generated in response to the determining.

15. The method of claim 10, wherein the adjusting comprises increasing common mode output voltage by a minimum voltage value that is sufficient to avoid the saturation of the instrumentation amplifier.

16. A system, comprising:
a first circuit configured to determine a common mode output voltage of an instrumentation amplifier based on the output voltage signals of the instrumentation amplifier; and
a second circuit configured to generate a control signal to minimize a difference between the common mode output voltage and a target voltage, wherein the generating comprises generating a controlled voltage signal that is applied at a control node between input resistors of the instrumentation amplifier based on comparing the common mode output voltage with the target voltage.

17. The system of claim 16, wherein the second circuit is further configured to determine that the common mode output voltage is greater than the target voltage.

18. The system of claim 17, wherein the second circuit is further configured to increase the control signal to pull up a voltage at the control node.

19. The system of claim 16, wherein the second circuit is further configured to determine that the common mode output voltage is less than the target voltage.

20. The system of claim 19, wherein the second circuit is further configured to decrease the control signal to pull down a voltage at the control node.

* * * * *